US006904671B1

(12) United States Patent
Farrens et al.

(10) Patent No.: US 6,904,671 B1
(45) Date of Patent: Jun. 14, 2005

(54) INTEGRATED CIRCUIT CHIP HANDLING APPARATUS AND METHOD

(75) Inventors: Oliver Farrens, Boise, ID (US); Roy Cashin, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/307,498

(22) Filed: May 7, 1999

(51) Int. Cl.[7] .............................................. H05K 3/00
(52) U.S. Cl. ............................ 29/829; 29/593; 29/741; 29/719
(58) Field of Search .......................... 29/829, 764, 278, 29/758, 762, 741, 842, 593, 719, 840

(56) References Cited

U.S. PATENT DOCUMENTS

| | | | |
|---|---|---|---|
| 2,357,600 A | 9/1944 | Pabst | 214/91 |
| 2,413,767 A | 1/1947 | Hyde | 198/27 |
| 2,454,548 A | 11/1948 | Brinkert | 74/424.8 |
| 2,495,541 A | 1/1950 | Nolan | 22/79 |
| 3,239,218 A | 3/1966 | Reeves | 271/61 |
| 3,254,776 A | 6/1966 | Brown | 214/2.5 |
| 3,327,889 A | 6/1967 | Dore | 220/6 |
| 3,628,672 A | 12/1971 | Heinz | 211/153 |
| 3,774,352 A | 11/1973 | Weber | 51/238 |
| 3,799,017 A | 3/1974 | Halligan | 83/167 |
| 3,837,510 A | 9/1974 | McWilliams | 214/152 |
| 3,887,997 A * | 6/1975 | Hartleroad et al. | 29/589 |
| 3,903,934 A | 9/1975 | Vizy | 140/105 |
| 3,937,386 A * | 2/1976 | Hartleroad et al. | 228/180 |
| 3,969,813 A * | 7/1976 | Minetti et al. | 29/575 |
| 4,123,044 A | 10/1978 | Petzi | 266/255 |
| 4,178,531 A | 12/1979 | Alig | 313/409 |
| 4,352,617 A | 10/1982 | Sakai | 414/95 |
| 4,353,796 A | 10/1982 | Kubo et al. | 209/240 |
| 4,354,770 A | 10/1982 | Block | 403/409 |
| 4,382,580 A | 5/1983 | Hellander | 254/89 |
| 4,461,073 A * | 7/1984 | Harringer et al. | 29/741 |
| 4,493,767 A | 1/1985 | Monteyne | 210/236 |
| 4,539,878 A | 9/1985 | Linker et al. | 83/99 |
| 4,543,716 A | 10/1985 | Damiano | 29/871 |
| 4,552,271 A | 11/1985 | Kranz | 211/41 |
| 4,577,563 A | 3/1986 | Sidler | 109/52 |
| 4,616,414 A * | 10/1986 | Cushman | 29/835 |
| 4,630,513 A | 12/1986 | Keller | 83/152 |
| D288,273 S | 2/1987 | Gould | D7/76 |
| 4,677,370 A * | 6/1987 | Tustaniwskyj et al. | 324/51 |
| 4,696,096 A * | 9/1987 | Green et al. | 29/829 |
| 4,711,334 A | 12/1987 | Barry et al. | 193/6 |
| 4,718,531 A | 1/1988 | Bianchi | 193/17 |
| 4,767,984 A | 8/1988 | Bakker | 324/158 |
| 4,772,079 A | 9/1988 | Douglas et al. | 312/257 |
| 4,790,515 A | 12/1988 | Pocci | 254/104 |
| 4,832,612 A | 5/1989 | Grabbe et al. | 439/71 |
| 4,884,420 A | 12/1989 | Finkel et al. | 70/58 |
| 4,891,242 A * | 1/1990 | Ito et al. | 427/53.1 |
| 4,926,677 A | 5/1990 | Waldner | 72/430 |
| 4,944,492 A | 7/1990 | Nonaka | 254/104 |

(Continued)

FOREIGN PATENT DOCUMENTS

| | | | | |
|---|---|---|---|---|
| CA | 843232 | 11/1964 | | |
| FR | 1.284.603 | 1/1962 | | |
| JP | 61-297047 | 12/1986 | | |
| JP | 63-202521 | 8/1988 | | |
| JP | 06314899 A * | 11/1994 | | 29/593 |

*Primary Examiner*—Carl J. Arbes
*Assistant Examiner*—Minh Trinh
(74) *Attorney, Agent, or Firm*—Perkins Coie LLP

(57) ABSTRACT

The present invention provides for an apparatus and method for handling integrated circuit (IC) chips such as thin small outline package (TSOP) IC chips. Embodiments of the invention are directed toward removal of TSOPs from device under test (DUT) boards. By use of magnetic forces generated by the invention, in combination with physical manipulation of the DUT boards and transfer structures, IC chips are quickly and efficiently transferred.

29 Claims, 3 Drawing Sheets

U.S. PATENT DOCUMENTS

| | | | |
|---|---|---|---|
| 4,947,981 A | 8/1990 | Dorner et al. | 198/360 |
| 4,965,927 A | 10/1990 | Holzman | 29/740 |
| H906 H | 4/1991 | Baggett et al. | 403/409.1 |
| 5,090,664 A | 2/1992 | McCullough et al. | 254/104 |
| 5,127,837 A * | 7/1992 | Shah et al. | 439/71 |
| 5,218,894 A | 6/1993 | College et al. | 83/23 |
| 5,245,900 A | 9/1993 | Dojnik | 83/81 |
| 5,263,567 A | 11/1993 | Costa | 198/382 |
| 5,290,134 A * | 3/1994 | Baba | 414/404 |
| 5,313,156 A | 5/1994 | Klug et al. | 324/158 |
| 5,322,173 A | 6/1994 | Kay | 211/153 |
| 5,332,463 A | 7/1994 | Eberlein et al. | 156/556 |
| 5,365,653 A * | 11/1994 | Padrun | 29/741 |
| 5,379,514 A * | 1/1995 | Okuda et al. | 29/833 |
| 5,402,563 A * | 4/1995 | Satoh et al. | 29/829 |
| 5,427,349 A | 6/1995 | Obrecht | 248/657 |
| 5,458,158 A | 10/1995 | Kawanabe | 140/105 |
| 5,463,227 A | 10/1995 | Stern et al. | 250/559.29 |
| 5,465,470 A | 11/1995 | Vongfuangfoo et al. | 29/559 |
| 5,467,023 A * | 11/1995 | Takeyama | 324/754 |
| 5,479,694 A * | 1/1996 | Baldwin | 29/593 |
| 5,481,202 A * | 1/1996 | Frye, Jr. | 324/754 |
| 5,487,471 A | 1/1996 | Marchek et al. | 206/725 |
| 5,566,414 A | 10/1996 | Nonaka | 14/73.5 |
| 5,566,840 A | 10/1996 | Waldner et al. | 211/41 |
| 5,588,797 A | 12/1996 | Smith | 414/797.5 |
| 5,600,150 A | 2/1997 | Stern et al. | 250/559.29 |
| 5,638,958 A | 6/1997 | Sanchez | 206/710 |
| 5,691,544 A | 11/1997 | Stern et al. | 250/559.29 |
| 5,717,162 A | 2/1998 | Matsuoka | 174/52.1 |
| 5,722,639 A | 3/1998 | Nonaka | 254/104 |
| 5,793,051 A | 8/1998 | Stern et al. | 250/559.2 |
| 5,829,115 A * | 11/1998 | Speller, Jr. et al. | 29/525.06 |
| 5,870,820 A * | 2/1999 | Arakawa et al. | 29/740 |
| 5,875,544 A * | 3/1999 | Chou | 29/741 |
| 5,909,706 A | 6/1999 | Jin et al. | 101/126 |
| 5,946,791 A * | 9/1999 | Baldwin | 29/593 |
| 6,062,119 A | 5/2000 | Overgaard | 83/23 |

* cited by examiner

INTEGRATED CIRCUIT CHIP HANDLING APPARATUS AND METHOD

TECHNICAL FIELD

The present invention is directed toward an apparatus and method for handling integrated circuit chips through coordinated physical manipulation and application of magnetic forces. More specifically, embodiments of the invention are directed toward removal of thin small outline package (TSOP) integrated circuits (ICs) from device under test (DUT) board sockets.

BACKGROUND OF THE INVENTION

It is known in the art of handling IC chips such as TSOP chips to rely on the magnetic properties of a chip to exert forces on the chip. Such forces have been used to lift or align chips or to pull a chip to test the electrical connections of the chip to another component. The IC chip may have a magnetically chargeable material such as iron, nickel, or cobalt fabricated into a layer of the chip through which a magnetic force may be applied to the chip. Alternatively or in addition, the leads of the chip may be made of a magnetically chargeable material. In any case, magnetic force has been proven to be effective in holding, lifting, or otherwise moving IC chips.

In the IC chip testing industry, chips are often placed in DUT boards in order to perform tests on individual chips. Tests are performed on each of the chips in the DUT board and the results of the tests are recorded. The test results are associated with a chip in a particular location in a DUT board. As a result of the tests, the chips are categorized as having varying levels of usable internal components. Chips of like categorization are removed from the DUT board and placed in groups. Based on the capacity of a chip, the chip will qualify for different uses. What is important in the handling of IC chips in the testing industry is that the chips be handled quickly and accurately. Speed is important because higher speed handling allows for more efficient and cost effective classification of chips. Accuracy is essential because mishandling can lead to misclassification, and consequently to re-testing of chips.

Currently it is conventional to handle IC chips both manually by hand and with automated transfer machines. In the testing industry, it is conventional to manually handle IC chips simple by grasping chips between the fingers or by holding them with tweezers. This practice is not optimal, however, because the small size and mass of IC chips can make the chips difficult to handle, and rough handling may lead to damage of the chips.

Conventional automated transfer machines grip IC chips by use of suction cups and vacuum lines. A vacuum line typically applies a suction force to a suction cup that is place on a flat surface of a chip. While the suction force is being applied, the chip can be lifted and moved. When the chip is located in a desired location, the suction force is removed and the chip is released to the place desired. A rubber bulb that may be pushed and released by an operator's thumb in order to generate a suction force characterizes a manual version of such a devise. The manual devise, however, is prone to lose suction and release the IC chip prematurely.

A number of problems are associated with suction cups and vacuum lines. For instance, suction cups and vacuum lines become inoperable when they are even partially severed or are punctured. Suction cups may lose effectiveness as they age and become brittle. Vacuum lines may also harden with age. Vacuum lines must be placed on the chip handling apparatus between a vacuum source and the suction cups. Vacuum lines are more delicate and susceptible to turns and pinching than are electrical wires for instance. Therefore, placing vacuum lines on the chip handling apparatus subjects the lines to damage.

Another characteristic of a DUT board that must be addressed when removing IC chips from the board is the locking feature of the board. A conventional DUT board has wire leads for making contact with the leads of an IC chip. The wire leads are positioned such that by depressing a body of a DUT board socket, the wire leads are spread apart to accept or release a chip. Therefore, to remove an IC chip from a DUT board, the DUT board socket must first be depressed. Only then will the force provided by the lifting device, such as the conventional suction cups and vacuum lines described above, be adequate to lift a chip from the DUT board. Therefore, any mechanism, whether automated or manual, must not only be capable of attaching to and lifting an IC chip, but must also cooperatively depress the DUT board socket to open the DUT board socket.

A problem left unsolved by the prior art is to provide a device capable of operating functions of a conventional DUT board, as well as capable of handling an IC chip by more durable and less maintenance intensive means. Therefore, an improved device would not only be capable of quickly attaching to an IC chip, but would also be capable of depressing a DUT board socket to release the chip from the socket. By combining these functions into a single, reliable, and maintainable device, overall performance is enhanced. Avoidance of the use of vacuum lines would be another desirable characteristic of an improved device.

SUMMARY OF THE INVENTION

An embodiment of the invention is an IC chip handling apparatus for removing an IC chip from a DUT board socket in a DUT board. The apparatus has a body and a depressor member coupled to the body. The depressor member is for depressing at least a portion of the DUT board socket to release the IC chip from the DUT board socket. The apparatus also includes a magnetic force source coupled to the body for generating a force to remove the IC chip from the DUT board socket.

Another embodiment is an IC chip handling apparatus for removing an IC chip from a DUT board socket in a DUT board. This embodiment includes a body positionable in a first position and a second position and a depressor member coupled to the body. When the body is in the first position, the depressor member does not depress the DUT board socket and the IC chip is held in DUT board socket by clamping of the DUT board socket. When the body is in the second position the depressor member does depress the DUT board socket to release the IC chip from clamping of the DUT board socket. This embodiment also has a magnetic force source coupled to the body. When the body is in the first position, the magnetic force source does not apply a magnetic force to the IC chip sufficient to lift and hold the IC chip. When the body is in the second position, the magnetic force source does apply a magnetic force to the IC chip sufficient to lift and hold the IC chip.

Yet another embodiment of the invention is an IC chip handling apparatus for transferring an IC chip between two locations that has a magnetic force source for attaching to a face of the IC chip when a current is applied. The magnetic force source is also for releasing from the face of the IC chip when the current is removed. Also included is a transfer mechanism coupled to the magnetic force source for moving the IC chip between the two locations. The transfer mechanism has a body and an actuator coupled to the body for moving the body substantially perpendicularly toward and away from the face of the IC chip. The transfer mechanism also has a transfer rail coupled to the body for moving the body between one of the locations and the other of the locations.

Still another embodiment of the invention is a method of handling an IC chip to remove the IC chip from a DUT board. To execute the method, depress at least a portion of a DUT board socket to release the IC chip from the DUT board. Additionally, apply a magnetic force to the IC chip to remove the IC chip from the DUT board socket.

Another embodiment is a method of transferring an IC chip from a DUT board to a second location. The acts of the method are to move a body coupled to a depressor member into contact with at least a portion of a socket of the DUT board to depress the socket and to energize an electromagnet that is coupled to the body to generate enough electromagnetic force in the electromagnet to remove the IC chip from the DUT board. Additional acts of the method are to move the body substantially perpendicularly away from the DUT board, translate the body to a second location, and remove the energizing current from the electromagnet to release the IC chip to the second location.

Another embodiment of the invention is method of manually removing an IC chip from a DUT board. The embodiment includes the acts of grasping an IC chip handling apparatus and pressing a depressor member of the IC chip handling apparatus onto at least a portion of a DUT board socket to release the IC chip from the DUT board socket. Additionally, the acts of attracting the IC chip to a magnetic force source, moving the IC chip handling apparatus to a second location, and removing the IC chip from the IC chip handling apparatus are performed.

DETAILED DESCRIPTION OF THE INVENTION

Figure 1:
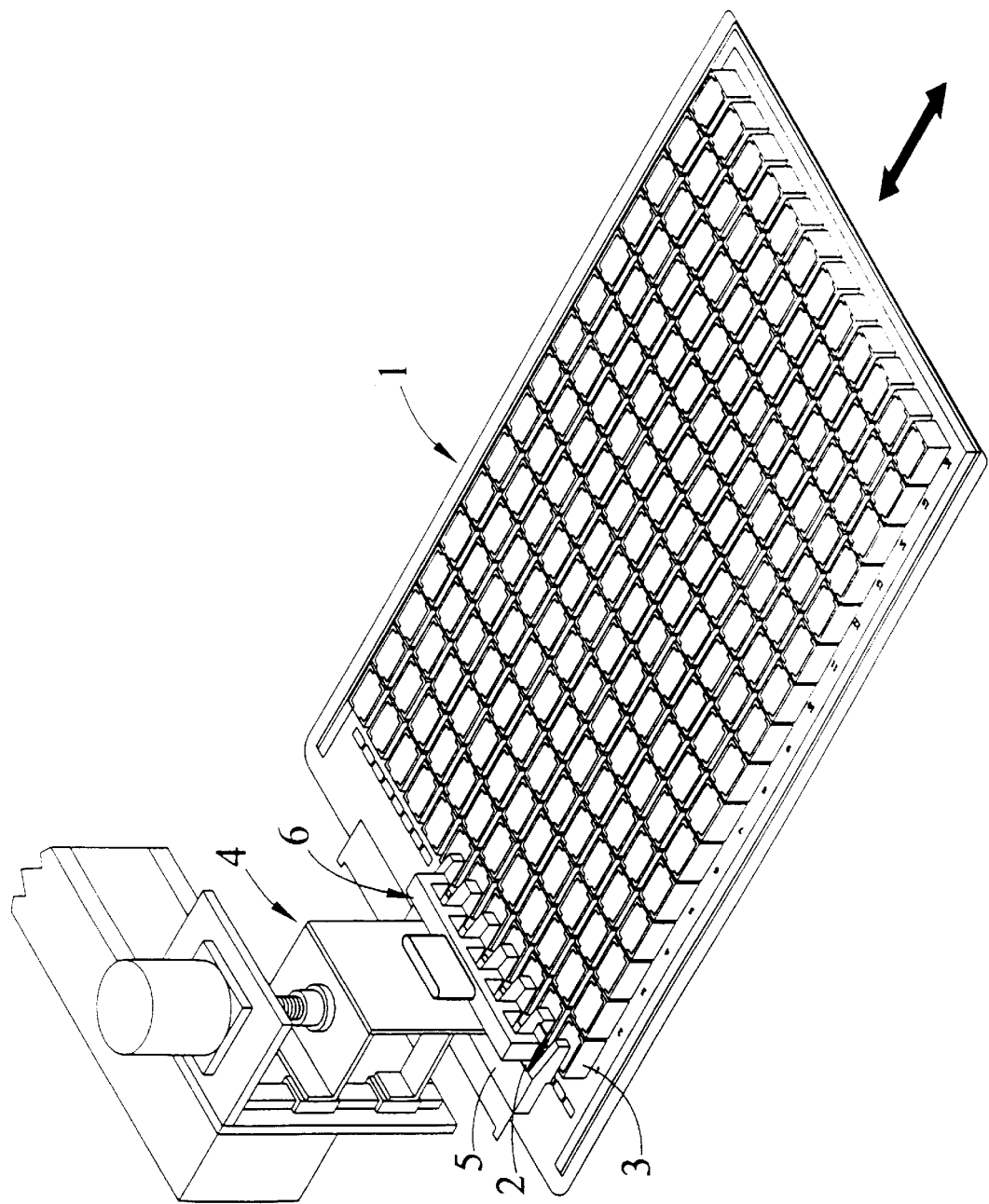
FIG. 1 is a perspective view of an embodiment of the invention including a DUT board on which the apparatus may operate.

Embodiments of the present invention are directed toward an integrated circuit (IC) chip handling apparatus for removing an IC chip from a device under test (DUT) board socket in a DUT board. One variety of DUT board that may be operated on by embodiments of the invention is the Systems Integration™, Model 4523-80002, 64/128M SDRAM, 54 Lead, thin small outline package (TSOP) board. As shown in FIG. 1, a DUT board 1 is a container for holding a matrix of IC chips 2 while the chips 2 are being tested. Each socket 3 in a DUT board 1 provides both physical restraint and electrical connection. The physical restraint or locking feature of DUT boards is described more fully in the background section above. DUT boards and the specifics of testing are well known in the art and are not the subject of the present invention. Therefore, the electrical testing process and the testing functions of DUT boards are not explained further herein.

One type of IC chip that may be handled in embodiments of the present invention is a TSOP chip. Other types of IC chips might also be handled in accordance with the invention. The chips described below are merely referred to as IC chips and this designation is intended to include IC chips of a wide variety of types as may be handled in embodiments of the invention.

As shown in FIG. 1, an embodiment of the invention includes a body 4. Coupled to the body 4 is a depressor member 5 for depressing at least a portion of the DUT board socket 3 to release the IC chip 2 from the DUT board socket 3. Additionally, a magnetic force source 6 is coupled to the body 4. The magnetic force source 6 is for generating a force to remove the IC chip 2 from the DUT board socket 3.

Figure 2:
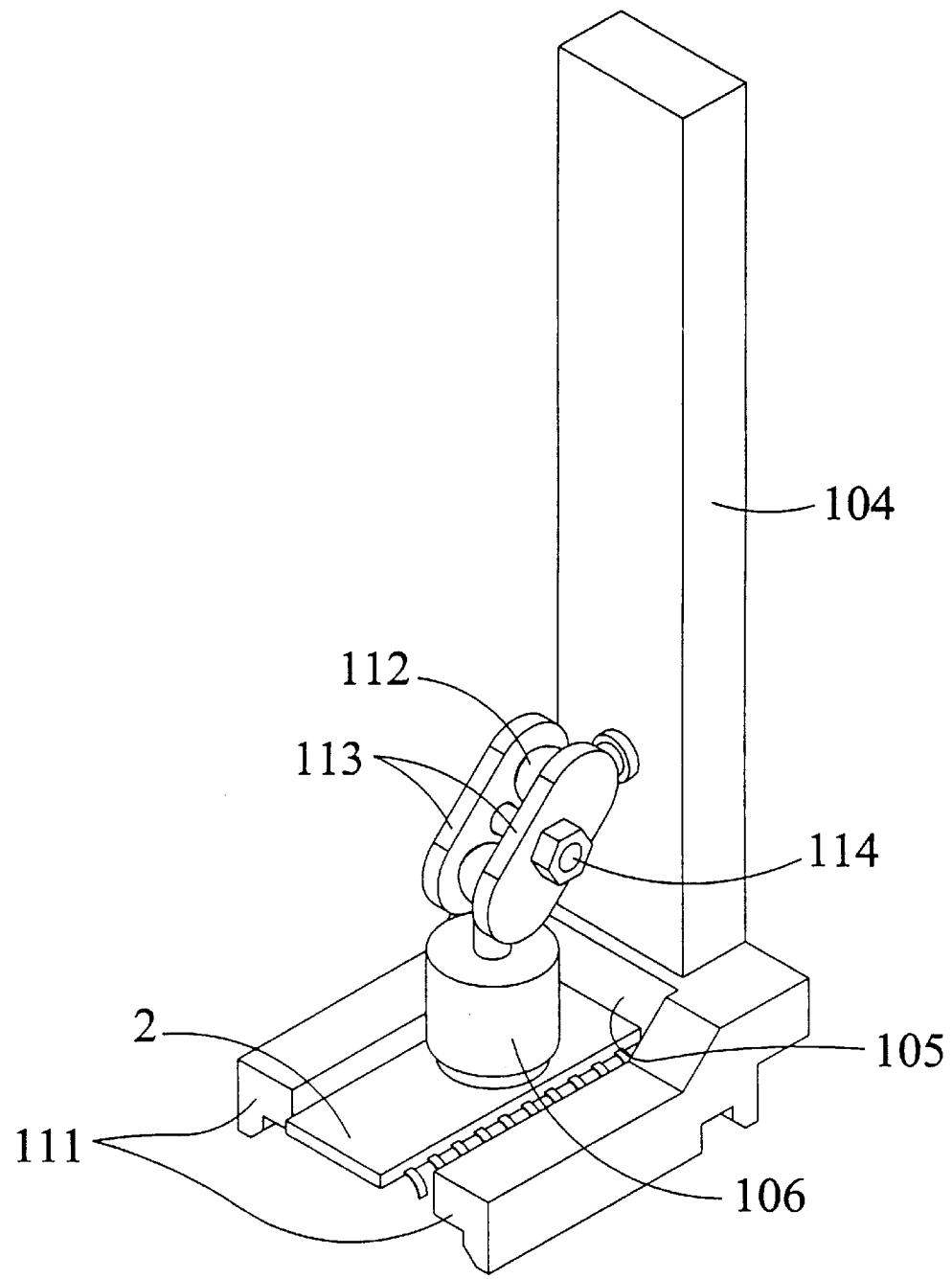
FIG. 2 is a perspective view of a manually operable embodiment of the invention.

Another embodiment of the invention is shown in FIG. 2. A body 104 couples to a depressor member 105. The depressor member 105 is for depressing at least a portion of the DUT board socket 3 (FIG. 1) to release an IC chip 2. The magnetic force source 106 is coupled to the body 104 for generating a force to remove the IC chip 2 from the DUT board socket.

Body

As shown in FIG. 2, a handle may characterize the body 104. The handle is for grasping by an operator who may use the apparatus to depress a DUT board socket to release an IC chip as detailed above.

Figure 3:
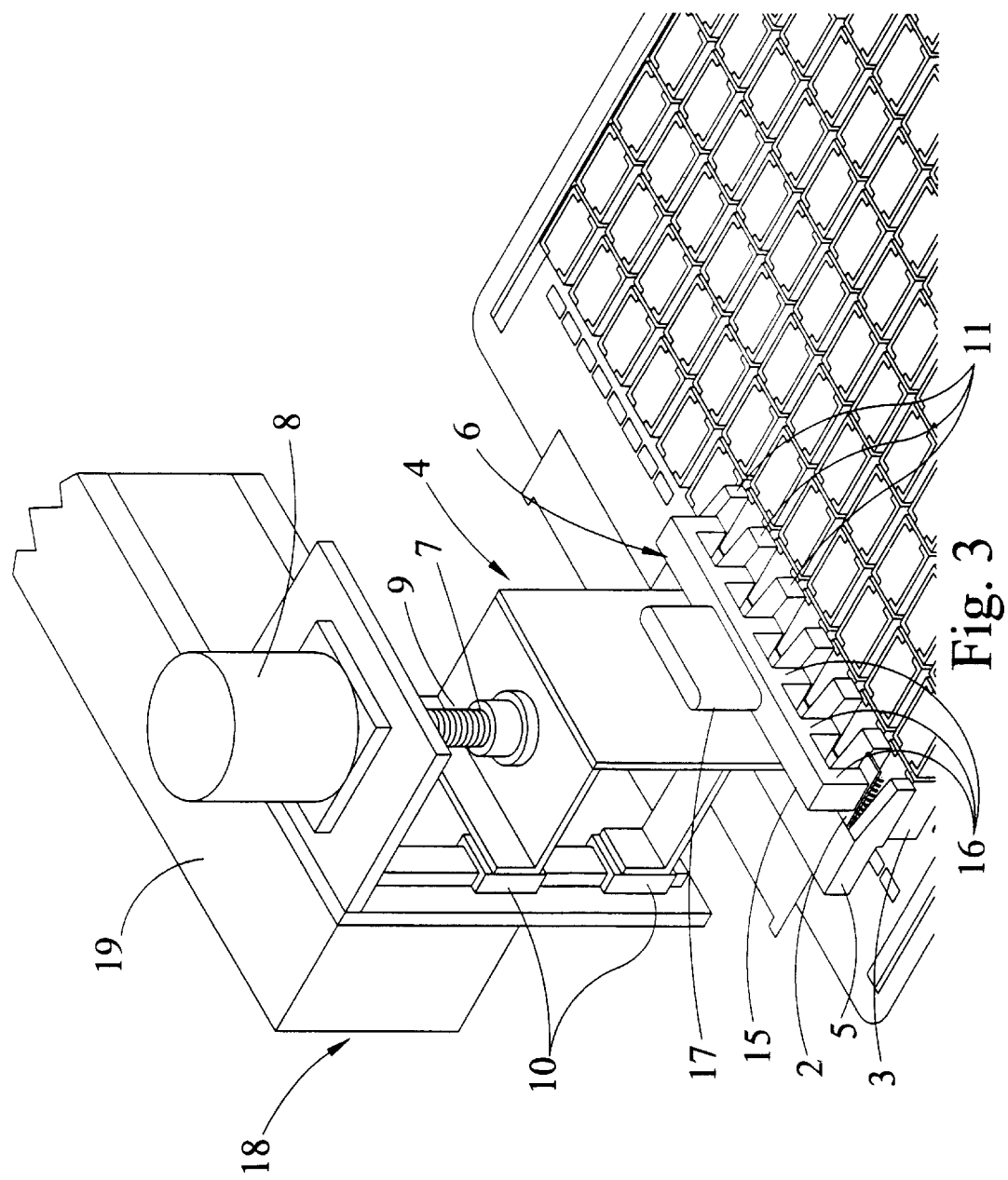
FIG. 3 is an enlarged perspective view of the embodiment of the invention of FIG. 1.

FIG. 3 illustrates an embodiment of the invention in which the body 4 includes a threaded hole 7. As shown, an actuator 8 is a motor having a threaded shaft 9. The threaded shaft 9 is coupled to the motor at one end and at the other end engages the threaded hole 7 of the body 4. When the motor is turned in a first direction, the body 4, and therefore and IC chip 2 attached to the body 4 through the magnetic force source 6, moves away from the DUT board. When the motor is turned in a second direction, the body 4 is moved toward the DUT board.

The actuator 8 may be any type of device capable of moving the body 4 linearly. Other examples of adequate devices include a linear motor, a hydraulic cylinder, or a cable system.

Embodiments of the invention may also include one or more slide bearings 10. The slide bearings 10 couple to the body 4 to guide the movement of the body toward and away from the DUT board. Such bearings are well known in the art and may be of any operable variety under the invention.

Depressor Member

FIG. 2 shows the depressor member 105 coupled to the body 104. The depressor member extends substantially perpendicularly from the body 104. The coupling between the depressor member 105 and the body 104 may be by any means capable of forming a sufficient structural attachment. As shown in FIG. 2, the depressor member has two prongs 111 substantially parallel to one another. The two prongs 111 are for depressing at least two sides of the DUT board socket 3 (FIG. 1).

FIG. 3 illustrates the depressor member 5 coupled to the body 4 and extending substantially perpendicularly from the body 4. Seven prongs 11 are shown that are substantially parallel to one another. The prongs 11 are for depressing portions of at least six DUT board sockets 3 to release IC chips 2 from the sockets. A variety of numbers of prongs could be used in embodiments of the invention. For instance, three prongs could be used to depress two sockets, or four prongs could be used to depress four sockets. That is, variable numbers of prongs could possibly depress different numbers of sockets because one prong may depress multiple sockets when, for instance, the sockets are juxtaposed.

Magnetic Force Source

FIG. 2 shows a magnetic force source 106 coupled to the body 104. The magnetic force necessary for embodiments of the invention is the amount of force necessary to remove an IC chip 2 from a DUT board socket. Alternatively, this force may be stated as at least the force necessary to retain the IC chip 2 when the IC chip is urged away from the magnetic force source by the static force of gravity (i.e. 1 G). The magnetic force source 106 illustrated in FIG. 2 is a ferromagnetic material possessing a residual magnetic charge, or in common terms a "permanent magnet." Examples of metals that maintain residual magnetic charges are iron, nickel, and cobalt. An electromagnet would work equally well with this or other embodiments.

The magnetic force source 106 of FIG. 2 is coupled to the body 104 through a pair of ball connectors 112 and two plates 113 employed to form sockets for the ball connectors. The opposite ends of the ball connectors 112 are connector pins that couple to the magnetic force source 106 and the body 104 respectively. A nut and bolt 114 provide a clamping force to the two plates 113 so that the plates may form sockets for the ball connectors 112. Through this arrangement, the magnetic force source 106 is readily adjustable relative to the depressor member 105. By readily adjustable, it is meant that adjustment may be accomplished with a minimal amount of effort by an operator. Such effort would be characterized by simple urging with a finger or perhaps by prying or turning with a small tool.

Still referring to FIG. 2, the magnetic force source 106 is located between two prongs 111 of the depressor member 105. Other embodiments might locate the magnetic force source 106 differently, for instance next to a single prong capable of depressing a DUT board socket.

FIG. 3 illustrates an embodiment of the invention in which the magnetic force source 6 includes electromagnet 17 connected to a transmission bar 15 that conducts magnetic charge to a number of stubs 16. Transmission bar 15 and the stubs 16 form a part of the magnetic force source 6, and a magnetic charge at least capable of retaining the IC chip 2 when the IC chip is urged away from each stub 16 by the static force of gravity must be transmitted to each stub 16. Electromagnets and their electrical current requirements for operation are well understood in the art and will not be specifically addressed herein. The magnetic force source 6 shown in FIG. 3 might also be a "permanent magnet."

The magnetic force source 6, through the extensions of the stubs 16, may be positioned above two or more DUT board sockets 3 and then used to simultaneously remove two or more chips from the two or more DUT board sockets. As is also seen in FIG. 3, portions of magnetic force source 6 may be located between two of the prongs 11 of the depressor member 5. Additionally, the connection of the magnetic force source 6 may be readily adjustable relative to the depressor member 5 through either adjustable connection provisions in the coupling of the magnetic force source 6 or the depressor member 5 to the body 4.

In embodiments, including embodiments that might be similar to those shown in either FIG. 2 or FIG. 3, the respective magnetic force sources may be conductively isolated from the body. The purpose of such isolation would be to prevent forces of magnetism from entering the bodies and other parts of the invention where unwanted magnetic forces could be realized. For example, if a magnetically conductive path were provided to the depressor members, there would be a tendency to attract IC chips to the depressor members rather than to the magnetic force source.

In one embodiment of the invention, the body 4 is positionable in a first position, as illustrated in FIG. 1, and a second position, as illustrated in FIG. 3. A depressor member 5 may be coupled to the body 4 so that when the body 4 is in the first position, the depressor member 5 does not depress the DUT board socket 3. Therefore, when the body 4 is in the first position, the IC chip 2 is held in the DUT board socket 3 by clamping of the socket 3. When the body 4 is in the second position, as in FIG. 3, the depressor member 5 depresses the DUT board socket 3 to release the IC chip 2 from clamping of the socket. Therefore, in the second position with the IC chip 2 released from the socket 3, a sufficient magnetic force may be applied by the magnetic force source 6 to the IC chip 2 to lift the chip from the DUT board 1 and hold the chip. The magnetic force source may either include a "permanent magnet" or an electromagnet.

TRANSFER EMBODIMENT

In accordance with FIG. 3, an embodiment of the invention is for transferring an IC chip 2 between two locations. The embodiment includes a magnetic force source 6 for attaching to a face of the IC chip 2 when a current is applied to the magnetic force source 6. Additionally, the magnetic force source 6 is for releasing from the face of the IC chip 2 when the current is removed from the magnetic force source 6.

Transfer Mechanism

The present embodiment also includes a transfer mechanism 18 coupled to the magnetic force source 6. The transfer mechanism 18 is for moving the IC chip 2 between two locations. The transfer mechanism 18 includes a body 4, an actuator 8, and a transfer rail 19. The body 4 is essentially the same as the body 4 described in detail above. The actuator 8 is coupled to the body 4 for moving the body substantially perpendicularly toward and away from the face of the IC chip 3. For the purposes of description of the movement toward and away for the chip 3, it is assumed that the IC chip is not being held by the magnetic force source 6 at the time of the movement. The actuator 8 is essentially the same as the actuator 8 described in detail above.

The transfer rail 19 is coupled to the body 4. The transfer rail 19 is for moving the body 4 between one of the two locations and the other of the two locations. The structure of the transfer rail 19 may be of any of a number of varieties known in the art. For instance, it may contain a pulley system for transferring force to a chassis that bears on an elongated channel. Alternatively, it may be a rack and pinion gear driven system. This and other varieties of transfer rail are contemplated by the invention.

Method of Handling an IC Chip

An embodiment of the invention is a method of handling an IC chip 2 performed to remove the IC chip from a DUT board 1. A first act of the method is to depress at least a portion of a DUT board socket 3 to release the chip 2 from the DUT board 1. The position of the body 4 and the magnetic force source 6 illustrated in FIG. 3 is consistent with the state of an apparatus after performing the first act of the present method.

An additional act of the method is to apply a magnetic force to the IC chip 2 to remove the chip from the DUT board socket 3. Completion of this act is illustrated by the location of the chips 2 that have been removed from the DUT board socket 3 in FIG. 3. The embodiment of FIG. 2 and others may also be used to perform the method of handling an IC chip.

Method of Transferring an IC Chip

Another embodiment of the invention is a method of transferring an IC chip from a DUT board to a second location. Referring to FIG. 3, an act of the method is to move a body 4 that is coupled to a depressor member 5 into contact with at least a portion of a socket 3 of the DUT board 1 to depress the socket 3. An additional act is to energize an electromagnet 17 that is coupled to the body 4 to generate enough electromagnetic force in the electromagnet 17 to remove the IC chip 2 from the DUT board socket 3. The body 4, along with the IC chip 2, may then be moved substantially perpendicularly away from the DUT board to a position consistent with the position illustrated in FIG. 1. By use of a component exemplified by the transfer rail 19, the body 4 may be translated to a second location. The second location could be another testing board such as a DUT board, a packaging area, or any other desired location within physical reach of the apparatus. Another act of the method may be to move the body 4 substantially perpendicularly toward the second location. A final act of the method is to remove the energizing current from the electromagnet 17 to release the IC chip 2 to the second location.

Method of Manually Removing an IC Chip

An embodiment of the invention is a method of manually removing an IC chip 2 from a DUT board 1 (FIG. 1). The method may be performed with the apparatus illustrate in FIG. 2. A first act of an operator is to grasp an IC chip handling apparatus such as the apparatus illustrate in FIG. 2. Another act is to press a depressor member 105 of the IC chip handling apparatus onto at least a portion of a DUT board socket to release the IC chip 2 from the DUT board socket. A magnetic force source 106 may then be used to attract the IC chip 2 to the magnetic force source 106. Another act is to move the IC chip handling apparatus to a second location. Finally, the IC chip 2 may be removed from the IC chip handling apparatus. Removal may be through automatic means such as by removal of current from an electromagnet when the magnetic force source 106 includes an electromagnet. Alternatively, the removal may simply be manually by means such as grasping and removing the IC chip with tweezers or fingers.

From the foregoing it will be appreciated that, although specific embodiments of the invention have been described herein for purposes of illustration, various modifications may be made without deviating from the spirit and scope of the invention. Accordingly, the invention is not limited except as by the claims.

ADVANTAGES OF THE INVENTION

The invention provides both an apparatus and method enabling quick attachment to an IC chip by use of magnetic force. In addition, the invention is capable of depressing a DUT board socket to release an IC chip from the socket. Embodiments of the invention combine these functions into a single, reliable, and maintainable device offering significant enhancements in overall performance. By avoiding the use of vacuum lines and suction cups that are delicate and susceptible to turns and pinching, longevity and ease of use are gained and simplicity is added to the fabrication of the IC chip handling apparatus. Methods of use employing the apparatus lead to faster and more accurate handling of IC chips throughout the testing process.

What is claimed is:

1. An IC chip handling apparatus for removing an IC chip from a DUT board socket in a DUT board comprising:
    a body;
    a depressor member coupled to said body for depressing at least a portion of the DUT board socket to release the IC chip from the DUT board socket; and
    a magnetic force source coupled to said body for generating a force to remove the IC chip from the DUT board socket.

2. The IC chip handling apparatus of claim 1 wherein said body includes a handle for grasping by an operator of said apparatus.

3. The IC chip handling apparatus of claim 1 wherein said body includes a threaded hole.

4. The IC chip handling apparatus of claim 3 further comprising an actuator coupled to said body for moving said body toward and away from the DUT board.

5. The IC chip handling apparatus of claim 4 wherein the actuator comprises a motor having a threaded shaft coupled to the motor for engaging the threaded hole of said body wherein turning of the motor in a first direction moves said body away from the DUT board.

6. The IC chip handling apparatus of claim 1 further comprising a slide bearing coupled to said body for guiding movement of said body toward and away from the DUT board.

7. The IC chip handling apparatus of claim 1 further comprising an actuator coupled to said body for moving said body toward and away from the DUT board.

8. The IC chip handling apparatus of claim 1 wherein said depressor member extends substantially perpendicularly from said body.

9. The IC chip handling apparatus of claim 1 wherein said depressor member includes two prongs substantially parallel to one another for depressing at least two sides of the DUT board socket.

10. The IC chip handling apparatus of claim 9 wherein said magnetic force source is located between two prongs of said depressor member.

11. The IC chip handling apparatus of claim 1 wherein said depressor member includes three prongs substantially parallel to one another for depressing portions of at least two DUT board sockets.

12. The IC chip handling apparatus of claim 1 wherein said magnetic force source is a ferromagnetic material possessing a residual magnetic charge at least capable of retaining the IC chip when the IC chip is urged away from said magnetic force source by the static force of gravity.

13. The IC chip handling apparatus of claim 1 wherein said magnetic force source includes an electromagnet.

14. The IC chip handling apparatus of claim 1 wherein said magnetic force source is readily adjustable relative to said depressor member.

15. The IC chip handling apparatus of claim 1 wherein said magnetic force source generates the force above two DUT board sockets to remove two IC chips from the two DUT board sockets respectively.

16. An IC chip handling apparatus for removing an IC chip from a DUT board socket in a DUT board comprising:
    a body positionable in a first position and a second position;
    a depressor member coupled to said body such that when said body is in the first position said depressor member does not depress the DUT board socket and the IC chip is held in DUT board socket by clamping of the DUT board socket, and when said body is in the second position said depressor member does depress the DUT board socket to release the IC chip from clamping of the DUT board socket; and
    a magnetic force source coupled to said body such that when said body is in the first position said magnetic force source does not apply a magnetic force to the IC chip sufficient to lift and hold the IC chip, and when said body is in the second position said magnetic force source does apply a magnetic force to the IC chip sufficient to lift and hold the IC chip.

17. The IC chip handling apparatus of claim 16 wherein said magnetic force source includes a ferromagnetic material possessing a residual magnetic charge capable of lifting and holding the IC chip from the DUT board when the body is in the second position.

18. The IC chip handling apparatus of claim 16 wherein said magnetic force source includes an electromagnet that is capable of lifting and holding the IC chip from the DUT board when the body is in the second position and current is applied to the electromagnet.

19. An IC chip handling apparatus for removing an IC ship from a DUT board socket in a DUT board comprising:
   a body including a threaded hole;
   a slide bearing coupled to said body for guiding movement of said body toward and away from the DUT board;
   an actuator comprising a motor having a threaded shaft coupled to the motor for engaging the threaded hole of said body wherein turning the motor in a first direction moves said body away from the DUT board;
   a depressor member comprising three prongs substantially parallel to one another for depressing portions of at least two DUT board sockets to release IC chips from the two DUT board sockets; and
   a magnetic force source coupled to said body comprising an electromagnet for generating a force to remove the IC ship from the DUT board socket wherein said magnetic force source is readily adjustable relative to said depressor member and said magnetic force source is located between two prongs of said depressor member.

20. An IC chip handling apparatus for transferring an IC chip between two locations comprising:
   a magnetic force source for attaching to a face of the IC chip when a current is applied to said magnetic force source and for releasing from the face of the IC chip when the current is removed from said magnetic force source; and
   a transfer mechanism coupled to said magnetic force source for moving the IC chip between the two locations, said transfer mechanism comprising:
      a body,
      an actuator coupled to the body for moving the body substantially perpendicularly toward and away from the face of the IC chip, and
      a transfer rail coupled to the body for moving the body between one of the locations and the other of the locations.

21. The IC chip handling apparatus of claim 20 wherein said transfer mechanism includes a slide bearing coupled between the actuator and the transfer rail for guiding movement of the body toward and away from the face of the IC chip.

22. The IC chip handling apparatus of claim 20 wherein the body includes a threaded hole.

23. The IC chip handling apparatus of claim 22 wherein the actuator comprises a motor having a threaded shaft coupled to the motor for engaging the threaded hole of the body wherein turning of the motor in a first direction moves the body substantially perpendicularly away from the face of the IC chip and turning the motor in a second direction moves the body substantially perpendicularly toward the face of the IC chip.

24. An IC chip handling apparatus for removing an IC chip from a DUT board socket in a DUT board comprising:
   a body;
   a means coupled to said body for depressing at least a portion of the DUT board socket to release the IC chip from the DUT board socket; and
   a means for magnetically attaching to the IC chip.

25. The IC chip handling apparatus of claim 24 wherein the means for magnetically attaching to the IC chip includes an electromagnet.

26. A method of handling an IC chip to remove the IC chip from a DUT board comprising:
   depressing at least a portion of a DUT board socket to release the IC chip from the DUT board; and
   applying a magnetic force to the IC chip to remove the IC chip from the DUT board socket.

27. A method of transferring an IC chip from a DUT board to a second location comprising:
   moving a body coupled to a depressor member into contact with at least a portion of a socket of the DUT board to depress the socket;
   energizing an electromagnet that is coupled to the body to generate enough electromagnetic force in the electromagnet to remove the IC chip from the DUT board;
   moving the body substantially perpendicularly away from the DUT board;
   translating the body to a second location; and
   removing the energizing current from the electromagnet to release the IC chip to the second location.

28. The method of claim 27 further comprising moving the body substantially perpendicularly toward the DUT board prior to removing the energizing current from the electromagnet.

29. A method of manually removing an IC chip from a DUT board comprising:
   grasping an IC chip handling apparatus;
   pressing a depressor member of the IC chip handling apparatus onto at least a portion of a DUT board socket to release the IC chip from the DUT board socket;
   attracting the IC chip to a magnetic force source;
   moving the IC chip handling apparatus to a second location;
   removing the IC chip from the IC chip handling apparatus.

* * * * *